United States Patent [19]
Baba et al.

[11] Patent Number: 5,902,719
[45] Date of Patent: May 11, 1999

[54] PROCESS FOR PROCESSING LITHOGRAPHIC PRINTING PLATE

[75] Inventors: Hideaki Baba; Makiko Oko; Toshiro Kondo, all of Tokyo, Japan

[73] Assignee: Mitsubishi Paper Mills Limited, Tokyo, Japan

[21] Appl. No.: 08/950,065

[22] Filed: Oct. 14, 1997

[30] Foreign Application Priority Data

Oct. 22, 1996 [JP] Japan ..................................... 8-279104

[51] Int. Cl.$^6$ ...................................................... G03C 8/28
[52] U.S. Cl. ...................... 430/416; 430/204; 430/278.1; 430/331; 430/417
[58] Field of Search ................................. 430/204, 278.1, 430/331, 416, 417

[56] References Cited

U.S. PATENT DOCUMENTS

| | | | |
|---|---|---|---|
| 5,427,889 | 6/1995 | Saikawa et al. | 430/204 |
| 5,691,105 | 11/1997 | De Keyzer et al. | 430/204 |
| 5,738,969 | 4/1998 | Kurokawa et al. | 430/204 |

*Primary Examiner*—Hoa Van Le
*Attorney, Agent, or Firm*—Cushman Darby & Cushman, IP Group of Pillsbury Madison & Sutro

[57] ABSTRACT

Disclosed is a process for processing a lithographic printing plate having a physical development nuclei layer between an aluminum support and a silver halide emulsion layer, which comprises processing the lithographic printing plate in the presence of a monocyclic azole compound having no mercapto group or a derivative thereof.

7 Claims, No Drawings

PROCESS FOR PROCESSING LITHOGRAPHIC PRINTING PLATE

BACKGROUND OF THE INVENTION

This invention relates to a process for processing a lithographic printing plate using an aluminum plate as a support and utilizing the silver complex diffusion transfer process.

Some examples of a lithographic printing plate using the silver complex diffusion transfer process (the DTR process) are described on pages 101 to 130 of André Rott and Edith Weyde, "Photographic Silver Halide Diffusion Processes", published by the Focal Press, London and New York (1972).

As described therein, there have been known two kinds of lithographic printing plates utilizing the DTR process, i.e., a two sheet type in which a transfer material and an image-receiving material are separated and a mono-sheet type in which these materials are provided on one support. The two sheet type lithographic printing plate is described in detail in Japanese Provisional Patent Publication No. 158844/1982. Also, the mono-sheet type is described in detail in U.S. Pat. No. 3,728,114.

A mono-sheet type lithographic printing plate using an aluminum plate as a support and utilizing the silver complex diffusion transfer process (hereinafter referred to as "an aluminum lithographic printing plate"), which is the target of the present invention, is described in detail in Japanese Provisional Patent Publications No. 118244/1982, No. 158844/1982, No. 260491/1988, No. 116151/1991 and No. 282295/1992 and U.S. Pat. No. 4,567,131 and No. 5,427,889.

In the above aluminum lithographic printing plate, physical development nuclei are carried on a roughened and anodized aluminum support, and a silver halide emulsion layer is further provided thereon. A general process for making this lithographic printing plate comprises the steps of exposure, development processing, water washing processing (removal of a silver halide emulsion layer, hereinafter merely referred to as "washing processing") and finishing processing.

Specifically, metallic silver image portions are formed on physical development nuclei by development processing, and by washing processing subsequent thereto, a silver halide emulsion layer is removed to expose the metallic silver image portions (hereinafter referred to as "silver image portions") on an aluminum support. Simultaneously, the surface of anodized aluminum itself is exposed as non-image portions.

In a lithographic printing plate using the DTR process, silver halide crystals in which sensitivity specks are generated by exposure become blacked silver by chemical development. On the other hand, unsensitized silver halide crystals become a silver complex by a silver complexing agent in a developing solution, and the silver complex is diffused to physical development nuclei and causes a physical development in the presence of the nuclei to form silver image portions.

The aluminum lithographic printing plate which is the target of the present invention has physical development nuclei under a silver halide emulsion layer and therefore differs in constitution from a conventionally and generally used lithographic printing plate having physical development nuclei on a silver halide emulsion layer. It has been found that such difference in constitution between them exerts influence on the properties of a silver image formed by plate making processing.

That is, it is considered that transfer efficiency and the like may vary to exert influence on the manner of forming transferred silver depending on whether a silver complex in an emulsion layer is diffused upward (to a developing solution side) or downward (to a support side). Namely, the aluminum lithographic printing plate which is the target of the present invention has problems peculiar to an aluminum lithographic printing plate that transfer efficiency is poor, a silver image in which the amount of transferred silver is small is liable to be formed and silver image portions in which the amount of transferred silver is small, for example, thin lines and dots have bad inking property. These problems cause lowering of printing reproducibility, i.e., a problem that a silver image of a lithographic printing plate cannot be faithfully reproduced on a print.

Printing reproducibility refers to a characteristic that a silver image of a lithographic printing plate is securely inked and the same image as the silver image can be reproduced on a print. When printing reproducibility is good, there is an advantage that before printing, an image of a print can be estimated by observing a silver image of a lithographic printing plate, which is important when a lithographic printing plate is made. When printing reproducibility is bad, there is a problem that before printing, it is not sure whether a desired print can be obtained or not, which lowers the operation efficiencies of plate making and printing.

In general, the inking property of a silver image exhibits by imparting oil sensitivity to the silver image by making a compound which makes a silver image oleophilic (an oleophilic property-imparting agent), for example, a compound having a mercapto group or a thione group described in Japanese Patent Publication No. 29723/1973 and Japanese Provisional Patent Publication No. 127928/1983 act. Similarly, the inking property of the aluminum lithographic printing plate which is the target of the present invention is also improved by imparting oil sensitivity to silver image portions. However, it is difficult to impart oil sensitivity to a silver image formed with low transfer efficiency as described above so that the problem in printing reproducibility as described above is caused.

Also, in order to obtain high contrast and good ink receptivity in a printing region, it has been disclosed to carry out development in the presence of 1-phenyl-5-mercapto-tetrazole having a substituent such as a carboxy group in Japanese Provisional Patent Publication No. 72630/1995, and it has been disclosed to carry out processing in the presence of a benzotriazole compound in Japanese Provisional Patent Publication No. 319165/1995. However, desired properties cannot be obtained by the above techniques.

On the other hand, as a lithographic printing plate utilizing the DTR process, there have been known a camera type lithographic printing plate which is made by exposure for several seconds to several ten seconds by a process camera, and a lithographic printing plate for scanning type exposure, which is directly made by using the beam of a laser (a helium-neon laser, an argon laser, a semiconductor laser, a light-emitting diode or the like). Scanning type exposure has an advantage that sharpness and resolution are more excellent than those of exposure by camera.

However, there is a problem that even when a lithographic printing plate having high resolution can be obtained by scanning type exposure, if the inking property of a silver image is bad and thin lines and dots on a plate surface cannot be faithfully reproduced on a print as described above, it is impossible to make the best use of the advantage of the lithographic printing plate for scanning type exposure.

SUMMARY OF THE INVENTION

An object of the present invention is to provide a process for processing a lithographic printing plate, in which the above problems can be solved and a silver image on the surface of a lithographic printing plate can be faithfully reproduced on a print. Particularly, it is to provide a process for processing a lithographic printing plate, which is suitable for making the best use of the high resolution of a lithographic printing plate for scanning type exposure.

The above object has been achieved by a process for processing a lithographic printing plate having a physical development nuclei layer between an aluminum support and a silver halide emulsion layer, which comprises processing the lithographic printing plate in the presence of a monocyclic azole compound having no mercapto group or a derivative thereof.

The effect of the present invention is further improved by further incorporating a nitrogen-containing heterocyclic compound having a mercapto group or a thione group into the lithographic printing plate. The process of the present invention is particularly suitably used for processing a lithographic printing plate for scanning type exposure.

DESCRIPTION OF THE PREFERRED EMBODIMENTS

In the following, the present invention is explained in detail.

The above compound to be used in the present invention is a monocyclic azole ring compound having no mercapto group as a substituent and having no fused ring such as an aromatic ring and a heterocyclic ring. A representative compound is represented by the following formula (1):

(1)

wherein $R^1$ represents a hydrogen atom, a halogen atom, an alkyl group (e.g., a methyl, ethyl, propyl, iso-propyl or butyl group), an amino group, an alkenyl group (e.g., an allyl group), an aralkyl group (e.g., a benzyl or phenethyl group), an aryl group (e.g., a phenyl, o-tolyl, m-tolyl, p-tolyl, m-chlorophenyl or p-nitrophenyl group), an alkoxy group, a hydroxy group, a carboxy group, a sulfo group, an alkoxycarbonyl group, an acylamide group, a sulfonamide group, an acyl group, an alkylsulfonyl group or the like; n represents an integer of 0 to 4, and when n is 2 or more, $R^1$s may be the same or different; and Z represents atomic groups necessary for forming an azole ring, and the azole ring includes pyrrole, imidazole, pyrazole, triazole, tetrazole, oxazole, oxadiazole, thiazole, thiadiazole and the like.

Preferred specific examples of the compound represented by the above formula (1) to be used in the present invention are represented by the following formulae (2) to (22).

(2)

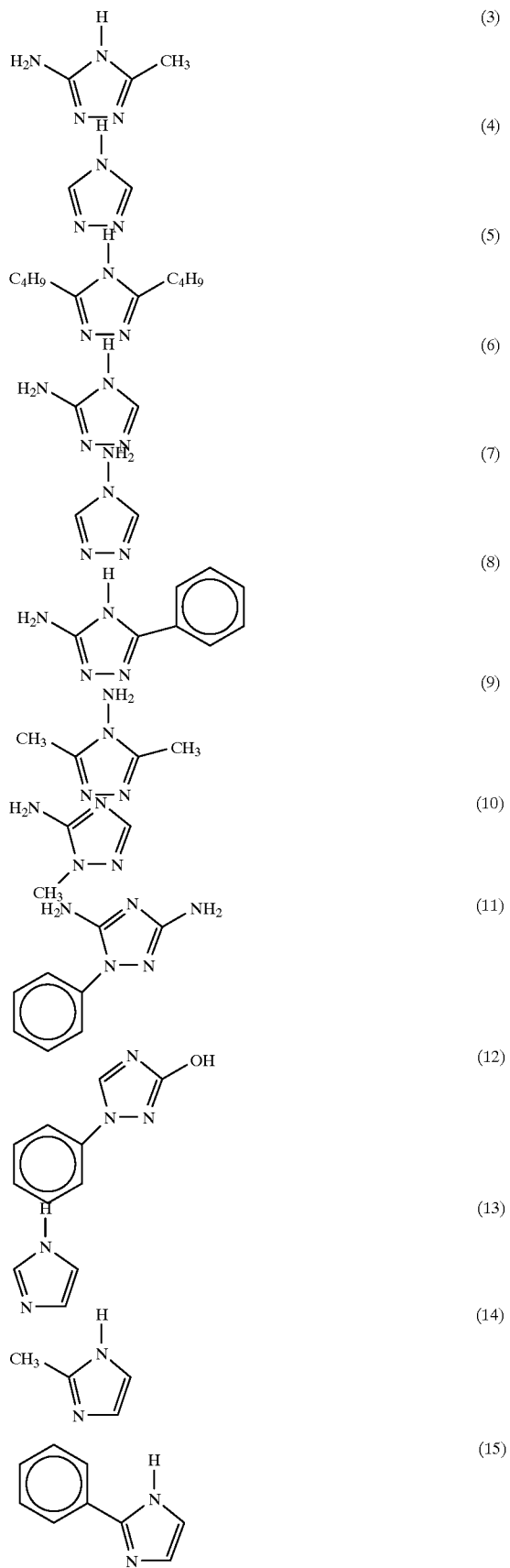

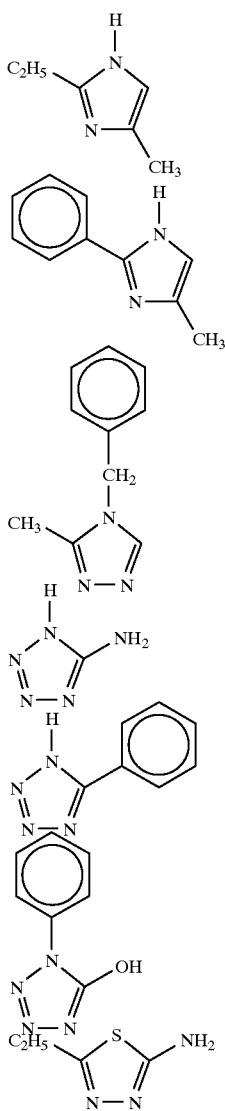

(16)
(17)
(18)
(19)
(20)
(21)
(22)

Among the above compounds, imidazole, triazole and substituted derivatives thereof are preferred, and imidazole having a phenyl group as a substituent and triazole having an amino group as a substituent are particularly preferred. The effects of the present invention are shown more effectively by incorporating imidazole or a substituted derivative thereof into a developing solution.

The above compound to be used in the present invention is contained in the lithographic printing plate and/or a developing solution. When the compound is contained in the lithographic printing plate, it may be contained in either of constitutional layers thereof, but it is preferably contained in the silver halide emulsion layer. The amount to be contained in the lithographic printing plate is 0.1 to 500 mg/m², preferably about 0.1 to 100 mg/m². The amount to be contained in a developing solution is preferably about 0.1 to 10 g/liter. The above azole compounds may be used in combination of two or more of them.

In the present invention, when the lithographic printing plate is processed in the presence of the above azole ring compound, a further effect of the present invention can be obtained by further incorporating a nitrogen-containing heterocyclic compound having a mercapto group or a thione group into the lithographic printing plate. The nitrogen-containing heterocyclic compound has been known as an antifoggant and the oleophilic property-imparting agent as described above. It is considered that in the present invention, when the nitrogen-containing heterocyclic compound is contained in the lithographic printing plate in combination with the above azole compound, a balance between physical development of DTR development and chemical development is made optimum.

As the nitrogen-containing heterocyclic compound having a mercapto group or a thione group to be used in the present invention, there may be mentioned a compound represented by the formula (23):

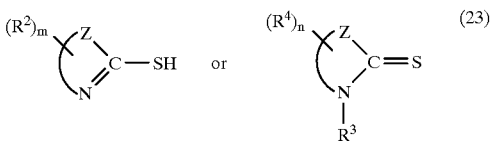

(23)

wherein $R^2$, $R^3$ and $R^4$ each independently represent a hydrogen atom, an alkyl group, an alkenyl group, an aralkyl group or an aryl group; m and n each represent an integer of 0 to 2; and Z represents atomic groups necessary for forming a 5- or 6-membered ring together with N and C in the formula.

As a specific example of the 5- or 6-membered ring, there may be mentioned imidazole, imidazoline, thiazole, thiazoline, oxazole, oxazoline, pyrazoline, triazole, thiadiazole, oxadiazole, tetrazole, pyridine, pyrimidine, pyridazine, pyrazine and triazine. The above ring may be a ring produced by condensing two or more rings such as bicyclic, tricyclic, etc. or may be fused with a benzene ring or a naphthalene ring.

As a specific example of the compound having a mercapto group or a thione group, there may be mentioned 2-mercapto-4-phenylimidazole, 2-mercapto-1-benzylimidazole, 2-mercapto-benzimidazole, 2-mercapto-1-butyl-benzimidazole, 1,3-dibenzyl-imidazolidine-2-thione, 2-mercapto-4-phenyl-thiazole, 3-butyl-benzothiazoline-2-thione, 3-dodecyl-benzothiazoline-2-thione, 2-mercapto-4,5-diphenyloxazole, 3-pentyl-benzoxazoline-2-thione, 1-phenyl-3-methyl-pyrazoline-5-thione, 3-mercapto-4-allyl-5-pentadecyl-1,2,4-triazole, 3-mercapto-5-nonyl-1,2,4-triazole, 3-mercapto-4-acetamide-5-heptyl-1,2,4-triazole, 3-mercapto-4-amino-5-heptadecyl-1,2,4-triazole, 2-mercapto-5-phenyl-1,3,4-thiadiazole, 2-mercapto-5-n-heptyl-oxathiazole, 2-mercapto-5-n-heptyl-oxadiazole, 2-mercapto-5-phenyl-1,3,4-oxadiazole, 5-mercapto-1-phenyl-tetrazole, 3-mercapto-4-methyl-6-phenyl-pyridazine, 2-mercapto-5,6-diphenyl-pyrazine, 2-mercapto-4,6-diphenyl-1,3,5-triazine and 2-amino-4-mercapto-6-benzyl-1,3,5-triazine, but the compound having a mercapto group or a thione group is not limited thereby.

The amount of the above nitrogen-containing heterocyclic compound having a mercapto group or a thione group to be contained in the lithographic printing plate is suitably 0.05 to 200 mg/m², preferably about 0.1 to 100 mg/m².

In the present invention, it is a preferred embodiment that triazole or a derivative thereof as the above azole compound and the nitrogen-containing heterocyclic compound are contained in the lithographic printing plate, and further imidazole, triazole or a derivative thereof is contained in a developing solution.

The lithographic printing plate which is the target of the present invention has physical development nuclei and the silver halide emulsion layer on the aluminum support. A silver halide emulsion is selected from generally used silver chloride, silver bromide, silver iodide, silver chlorobromide, silver chloroiodobromide, silver iodobromide and the like, and an emulsion mainly comprising silver chloride (which means a silver halide emulsion comprising 50 mole % or more of silver chloride) is preferred.

The type of the emulsion may be either negative type or positive type. The above silver halide emulsion can be chemically sensitized or spectrally sensitized, if necessary.

In the present invention, as a sensitizing dye which is suitably used in the lithographic printing plate for scanning type exposure, there may be mentioned sensitizing dyes described in Japanese Provisional Patent Publications No. 127701/1997 and No. 222734/1997 for an argon laser, and sensitizing dyes described in Japanese Provisional Patent Publications No. 251853/1990, No. 274055/1991 and No. 9853/1992 and Japanese Patent Application No. 45874/1996 for red and infrared lasers.

Gelatin is preferably used as a hydrophilic colloid of the silver halide emulsion layer when silver halide particles are prepared. As the gelatin, there may be used various gelatins such as acid-treated gelatin and alkali-treated gelatin. Also, modified gelatins thereof (e.g., phthalated gelatin and amidated gelatin) can be used. Further, a hydrophilic high molecular weight compound such as polyvinyl pyrrolidone, various starches, albumin, polyvinyl alcohol, gum arabic and hydroxyethyl cellulose can be contained. As the hydrophilic colloid, a hydrophilic colloid substantially containing no hardener is desirably used in order to facilitate peeling of the silver halide emulsion layer after development. The amount of the gelatin to be contained in the silver halide emulsion layer is about 1 to 10 g/m$^2$, preferably 2 to 5 g/m$^2$.

As the roughened and anodized aluminum plate to be used in the present invention, for example, an aluminum plate described in U.S. Pat. No. 5,427,889 may be mentioned and preferably used. According to U.S. Pat. No. 5,427,889, a roughened state of the surface can be easily confirmed by a photograph magnified at a ratio of about 50,000 taken by using a scanning type electron microscope. It is preferred that 500 or more pits having a diameter of 0.03 to 0.30 μm exist per 100 μ$^2$. The upper limit of the number of the pits is preferably about 15,000. Favorable results can be given when the average diameter of the pits having a diameter of 0.03 to 0.30 μm is 0.05 to 0.20 μm, particularly 0.05 to 0.15 μm. The diameter of a pit having a shape other than a circle is a size when its shape is regarded as a circle. The central depth of the pit is desirably ⅓ (0.01 to 0.10 μm) or more, preferably ½ (0.015 to 0.15 μm) to 3 (0.03 to 0.90 μm) based on the diameter of the pit.

In Japanese Provisional Patent Publication No. 28893/1981, there are described a grain structure of a composite structure comprising a plateau (a primary structure) and pits (a secondary structure formed on the surface of the plateau) on an aluminum surface by using mechanical roughening, chemical etching and electrolytic roughening in combination. It is preferred that the fine pits of the present invention have a composite structure that they exist on large pits (a plateau) having an average diameter of 3 to 15 μm. The projected area of the fine pits is preferably about 5 to 40%, and the projected area of the above large pits (a plateau) is preferably about 50 to 95%. A center line average roughness (Ra: measured according to JIS B 0601) is preferably in the range of 0.3 to 1.0 μm. The aluminum plate having such a surface shape of the present invention is determined by a combination of a large number of conditions such as conditions of mechanical roughening processing, chemical roughening processing and electrolytic roughening processing, conditions of anodization and an alloy composition of an aluminum plate, but it can be relatively easily found by, for example, a method of subjecting an aluminum plate to electrolytic roughening processing by regulating the kind of an acid, the concentration of an acid, electrolytic temperature, current density, applied voltage and the like and then subjecting the resulting roughened aluminum plate to anodization processing.

The thickness of an anodized layer of the roughened and anodized aluminum plate to be used in the present invention is preferably in the range of about 0.3 to 3.0 μm. It is preferred to subject the roughened aluminum plate to desmutting processing prior to anodization processing. That is, the roughened aluminum plate is processed with 10 to 50% hot sulfuric acid (40 to 60° C.) or a diluted alkali (sodium hydroxide or the like) to remove smut attached to the surface thereof.

After anodization processing is carried out, post-processing may be carried out, if necessary. For example, there may be used a method of dipping a plate in an aqueous solution of polyvinylphosphonic acid as disclosed in U.K. Patent No. 1230447. Also, if necessary, an undercoat layer of a hydrophilic polymer can be provided depending on the properties of a photosensitive layer to be provided thereon.

As the physical development nuclei in the physical development nuclei layer to be used in the present invention, known physical development nuclei used in the silver complex diffusion transfer process may be used. As an example thereof, there may be used a colloid of gold, silver or the like, a metal sulfide obtained by mixing a water-soluble salt of palladium, zinc and the like with a sulfide, and so on. As a protective colloid, various hydrophilic colloids may be used. With respect to details of the physical development nuclei and preparation process thereof, reference can be made to, for example, André Rott and Edith Weyde, "Photographic Silver Halide Diffusion Processes", published by the Focal Press, London and New York (1972).

In the present invention, a water-swellable intermediate layer described in Japanese Provisional Patent Publication No. 116151/1991 may be provided between the physical development nuclei layer and the silver halide emulsion layer.

The developing solution to be used in the present invention may contain additives such as a developing agent, for example, polyhydroxybenzenes and 3-pyrazolidinones; an alkaline substance, for example, potassium hydroxide, sodium hydroxide, lithium hydroxide and sodium tertiary phosphate; an amine compound; a preservative, for example, sodium sulfite; a viscosity modifier, for example, carboxymethyl cellulose; an antifoggant, for example, potassium bromide; a development modifier, for example, a polyoxyalkylene compound; and a silver halide solvent, for example, thiosulfate, thiocyanate, cyclic imide and thiosalicylic acid.

The pH of the developing solution is generally about 10 to 14, preferably about 12 to 14, but it may vary depending on the condition of pre-processing (e.g., anodization) of the aluminum support of the lithographic printing plate to be used, a photographic element, a desired image, the kinds and amounts of various compounds in the developing solution, development conditions and the like.

EXAMPLES

The present invention is described in detail by referring to Examples.

Example 1

By electrolytic roughening processing and anodization, an aluminum plate having a thickness of 0.30 mm and about 5,600/100 μm² of pits having a diameter of 0.03 to 0.30 μon a plateau having an average diameter of about 5 μm, in which the average diameter of these pits was 0.08 μm, was obtained. This aluminum plate was subjected to anodization after roughening processing and had an average roughness (Ra) of 0.5 to 0.6 μm.

As physical development nuclei, a physical development nuclei solution was prepared according to the preparation process of Nuclei solution (A) described in Japanese Provisional Patent Publication No. 208843/1988, which is incorporated herein by reference, and adjusted to pH 6.8. This physical development nuclei solution was coated on the above aluminum support.

A silver halide emulsion was prepared as described below. While maintaining an aqueous solution of inert gelatin at 60° C. and stirring the solution vigorously, a sodium chloride aqueous solution was added thereto at a rate of 4 ml/min to prepare a silver chloride emulsion. The particles of the emulsion had an average particle size of 0.3 μm, their crystal habit was cubic, and 90% by weight or more of the particles were within ±30% of the average particle size. The emulsion obtained as described above was subjected to deposition and washing processings and then dissolved again according to conventional methods. Further, sodium thiosulfate and chloroauric acid were added to the emulsion, and the mixture was chemically sensitized and further orthochromatically sensitized.

A surfactant was added to the silver halide emulsion to prepare a coating solution (pH 4.0). To this coating solution were added the compounds of the present invention shown in Table 1 and the following comparative compounds of the formulae (24) to (26) so as to have a concentration of 10 mg/m², respectively. Each silver halide emulsion thus prepared was coated on the aluminum support on which physical development nuclei had been coated, so that the amount of silver became 2 g/m² (the amount of gelatin: 3 g/m²).

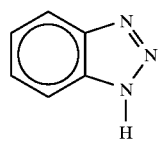
(24)

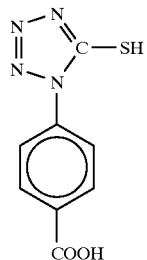
(25)

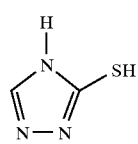
(26)

Lithographic printing plates thus obtained were subjected to camera exposure by using a resolution chart so that thin lines of 50 μm were obtained, developed with the following developing solution at 20° C. for 20 seconds and immediately washed with running water for 30 seconds to wash away a gelatin layer. Subsequently, a plate surface-protecting solution described in Japanese Provisional Patent Publication No. 265217/1993, which is incorporated herein by reference, was coated on the lithographic printing plates.

The printing plates obtained were set in a printer Heidelberg TOK (a trade name of an offset printing press manufactured by Heidelberg Co.), and printing was carried out. The reproducibilities of thin lines of 100th prints after printing was started were measured by a microdensitometer. In Table 1, the widths of lines on the prints reproduced from thin lines of 50 μm on the printing plates are shown. As the numerical value of the thin line on the print is closer to 50 μm, reproducibility is more excellent

TABLE 1

| Lithographic printing plate No. | Compound | Thin line on print (μm) | Remarks |
|---|---|---|---|
| 1 | Compound of the formula (2) | 47 | Present invention |
| 2 | Compound of the formula (3) | 47 | Present invention |
| 3 | Compound of the formula (4) | 44 | Present invention |
| 4 | Compound of the formula (5) | 44 | Present invention |
| 5 | Compound of the formula (6) | 47 | Present invention |
| 6 | Compound of the formula (15) | 44 | Present invention |
| 7 | Compound of the formula (17) | 44 | Present invention |
| 8 | Compound of the formula (24) | 35 | Comparison |
| 9 | Compound of the formula (25) | 35 | Comparison |
| 10 | Compound of the formula (26) | 35 | Comparison |
| 11 | None | 32 | Comparison |

From the results in Table 1, it can be seen that when the compound of the present invention is used, the difference in width between the thin line on the printing plate and the thin line on the print is reduced, and the line on the printing plate is almost faithfully reproduced.

Example 2

Procedures were carried out in the same manner as in Example 1 except for adding 2 g/liter of the compounds of the present invention shown in Table 1 and the comparative compounds of the formulae (24) to (26) to the developing solution, respectively, without adding them to the silver halide emulsion layers. The resulting printing plates were tested in the same manner as in Example 1. As a result, the width of the thin line on the print in the case of adding the compound of the formula (15) or (17) to the developing solution was 47 μm, and the same results as in Example 1 were obtained in other cases.

Example 3

Procedures were carried out in the same manner as in Example 1 except for further adding 1 mg/m² of 2-mercapto-5-phenyl-1,3,4-oxadiazole or 2-mercaptobenzimidazole to the silver halide emulsion layers of the lithographic printing plates No. 1 to No. 7 which were the printing plates of the present invention prepared in Example 1. The resulting printing plates were tested in the same manner as in Example 1. As a result, the widths of the thin lines on the prints were 50 μm which is the same as the widths of the thin lines of the printing plates.

Example 4

As a silver halide emulsion, a silver chloroiodobromide emulsion (20 mole % of AgBr and 0.4 mole % of AgI)

having an average particle size of 0.2 μm, with which 0.006 mmole of potassium hexachloroiridate (IV) per 1 mole of silver was doped, was prepared by the control double jet method. As a protective colloid, alkali-treated gelatin was used. Further, the emulsion was subjected to sulfur-gold sensitization and spectrally sensitized by using 3 mg of a sensitizing dye represented by the following formula per 1 g of silver.

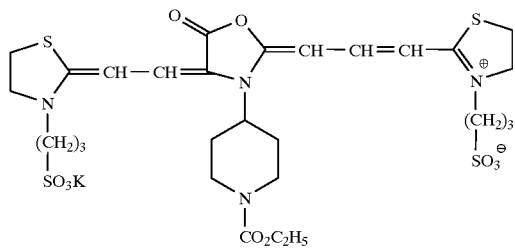

A surfactant and the compounds of the present invention and the comparative compounds shown in Table 2 were added to the silver halide emulsion prepared as described above, respectively, and each mixture was coated on the aluminum support on which the above physical development nuclei had been coated, so that the amount of silver became 2 g/m² (the amount of gelatin: 3 g/m²), followed by drying, to obtain a lithographic printing material for scanning type exposure.

On the lithographic printing materials, a 10% dot image was outputted by an outputting machine using a red LD laser of 633 nm as a light source, and the materials were processed in the same manner as in Example 1 to obtain lithographic printing plates. Printing was carried out in the same manner as in Example 1 by using the printing plates obtained, and the dot areas of prints when 100 sheets were printed were measured. The results are shown in Table 2. As the dot area of the print is closer to 10%, the image on the plate surface is more faithfully reproduced on the print.

TABLE 2

| Lithographic printing plate No. | Compound | Dot area (%) | Remarks |
| --- | --- | --- | --- |
| 12 | Compound of the formula (2) | 9 | Present invention |
| 13 | Compound of the formula (3) | 9 | Present invention |
| 14 | Compound of the formula (4) | 8 | Present invention |
| 15 | Compound of the formula (5) | 8 | Present invention |
| 16 | Compound of the formula (6) | 9 | Present invention |
| 17 | Compound of the formula (15) | 8 | Present invention |
| 18 | Compound of the formula (17) | 8 | Present invention |
| 19 | Compound of the formula (24) | 5 | Comparison |
| 20 | Compound of the formula (25) | 4 | Comparison |
| 21 | Compound of the formula (26) | 4 | Comparison |
| 22 | None | 3 | Comparison |

In a lithographic printing plate for scanning type exposure which can be exposed by using a laser as a light source, high resolution can be obtained. However, in the comparative printing plates, the reproducibilities of the images on the prints are low. To the contrary, in the printing plates of the present invention, the dots on the plate surfaces are reproduced almost faithfully.

Example 5

Procedures were carried out in the same manner as in Example 4 except for further adding 1 mg/m² of 2-mercapto-5-phenyl-1,3,4-oxadiazole or 2-mercaptobenzimidazole to the silver halide emulsion layers of the lithographic printing plates No. 12 to No. 18 for scanning type exposure prepared in Example 4. The resulting printing plates were tested in the same manner as in Example 4. As a result, all of the dot areas of the prints were 10%.

According to the present invention, in printing using an aluminum lithographic printing plate utilizing the silver complex diffusion transfer process, the difference between an image on the surface of the lithographic printing plate and an image on a print can be substantially removed. Particularly in a lithographic printing plate for scanning type exposure, by which high resolution can be obtained, it is possible to make the best of the advantage of the lithographic printing plate for scanning type exposure for the first time by faithfully reproducing a silver image on a plate surface on a print.

We claim:

1. A process for processing a lithographic printing plate having a physical development nuclei layer between an aluminum support and a silver halide emulsion layer, which comprises processing the lithographic printing plate in the presence of a monocyclic azole compound having no mercapto group or a derivative thereof.

2. The process according to claim 1, wherein the compound is imidazole or a derivative thereof, or triazole or a derivative thereof.

3. The process according to claim 1, wherein the compound is a compound represented by the formula (1):

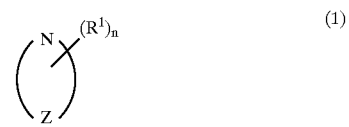

wherein R¹ represents a hydrogen atom, a halogen atom, an alkyl group, an amino group, an alkenyl group, an aralkyl group, an aryl group, an alkoxy group, a hydroxy group, a carboxy group, a sulfo group, an alkoxycarbonyl group, an acylamide group, a sulfonamide group, an acyl group or an alkylsulfonyl group; n represents an integer of 0 to 4, and when n is 2 or more, $R^1$s may be the same or different; and Z represents atomic groups necessary for forming an azole ring, and the azole ring includes pyrrole, imidazole, pyrazole, triazole, tetrazole, oxazole, oxadiazole, thiazole and thiadiazole.

4. The process according to claim 3, wherein the compound is added to a lithographic printing plate in an amount of 0.1 to 500 mg/m² or to a developing solution in an amount of 0.1 to 10 g/liter.

5. The process according to claim 1, wherein the lithographic printing plate contains a nitrogen-containing heterocyclic compound having a mercapto group or a thione group.

6. The process according to claim 5, wherein the nitrogen-containing heterocyclic compound is added to a lithographic printing plate in an amount of 0.05 to 200 mg/m².

7. The process according to claim 1, wherein the lithographic printing plate is a lithographic printing plate for scanning type exposure.

* * * * *